(12) United States Patent
Handforth et al.

(10) Patent No.: US 6,600,395 B1
(45) Date of Patent: Jul. 29, 2003

(54) EMBEDDED SHIELDED STRIPLINE (ESS) STRUCTURE USING AIR CHANNELS WITHIN THE ESS STRUCTURE

(75) Inventors: Martin R. Handforth, Kanata (CA); Herman Kwong, Kanata (CA); Richard R. Goulette, Arnprior (CA)

(73) Assignee: Nortel Networks Limited, Quebec (CA)

( * ) Notice: Subject to any disclaimer, the term of this patent is extended or adjusted under 35 U.S.C. 154(b) by 69 days.

(21) Appl. No.: 09/749,412

(22) Filed: Dec. 28, 2000

(51) Int. Cl.[7] .................................................. H01P 3/08
(52) U.S. Cl. ............................... 333/238; 333/4; 333/5; 174/117 AS
(58) Field of Search ......................... 333/1, 4, 5, 238, 333/243, 244, 246; 174/117 AS (56) References Cited

U.S. PATENT DOCUMENTS

| | | | |
|---|---|---|---|
| 4,521,755 A | 6/1985 | Carlson et al. | 333/244 |
| 4,614,922 A | 9/1986 | Bauman et al. | 333/161 |
| 5,712,607 A | 1/1998 | Dittmer et al. | 333/238 |
| 5,724,012 A * | 3/1998 | Teunisse | 333/244 X |
| 6,414,573 B1 * | 7/2002 | Swineford et al. | 333/238 |

* cited by examiner

*Primary Examiner*—Benny Lee
(74) *Attorney, Agent, or Firm*—Hunton & Williams LLP (57) ABSTRACT

A technique for facilitating signal transmission at high signal frequencies in a multi-layer substrate is disclosed. In one embodiment a multi-layer substrate comprises a conductor or pair of conductors, a first dielectric layer on a first side of the conductor or pair of conductors and a second dielectric layer on a second side of the conductor or pair of conductors. An air channel is provided in the first dielectric layer, the air channel formed to be substantially coextensive with the conductor or pair of conductors. A conductive shield surrounds the conductor or pair of conductors, the first dielectric layer, and the second dielectric layer in order to eliminate crosstalk. The conductor or pair of conductors may have discrete spaced edges and the width of the conductor or pair of conductors may be increased in order to adjust the impedance because of the low dielectric constant of air. Furthermore, additional air channels and a supporting layer may be included in the structure.

12 Claims, 7 Drawing Sheets

EMBEDDED SHIELDED STRIPLINE (ESS) STRUCTURE USING AIR CHANNELS WITHIN THE ESS STRUCTURE

CROSS-REFERENCE TO RELATED APPLICATIONS

This patent application is related to U.S. patent application Ser. No. 09/749,435, entitled "Technology Implementation of Suspended Stripline Within Multi-layer Substrate Used to Vary Time Delay and to Maximize the Reach of Signals with High Data Rates or High Frequencies," which is hereby incorporated by reference herein in its entirety. This patent application is additionally related to U.S. patent application Ser. No. 09/749,411, entitled "Suspended Stripline Structures to Reduce Skin Effect and Dielectric Loss to Provide Low Loss Transmission of Signals with High Data Rates or High Frequencies", which is also hereby incorporated by reference in its entirety. Both of the aforementioned applications are filed concurrently herewith. This patent application is also related to U.S. patent application Ser. No. 09/443,128 entitled "Zero Cross-Talk Signal Line Design", filed on Nov. 18, 1999, now U.S. Pat. No. 6,444,922, issued Sep. 3, 2002, which is hereby incorporated by reference in its entirety.

FIELD OF THE INVENTION

The present invention relates generally to a technique for improving the transmission of high bit rates or high signal frequencies within a substrate, and more particularly, to a technique for minimizing losses, skin effect, and cross-talk between adjacent signal conductors, and increasing propagation speed.

BACKGROUND OF THE INVENTION

The present state of the art in multi-layer substrates is to sandwich a conventional rectangular stripline between two substrate layers, which are generally dielectric layers.

Each substrate layer has an associated loss tangent, which indicates the amount of signal loss due to the dielectric effects of the substrate layers that are adjacent to the stripline. At high bit rates or high signal frequencies, the effect of the loss tangent increases, thereby causing more loss. An additional problem inherent in the prior art results from a phenomenon known as "skin effect". When current is passed through a conductor, the current tends toward the outside of the conductor thereby creating an outer skin of current. The cross-sectional area of the skin is less than the cross-sectional area of the conductor, thereby creating additional losses. The skin effect worsens as the frequency of the transmitted signal increases as shown by the following equation:

$$\text{skin depth} = 1/\sqrt{(f \pi \sigma \mu)} \qquad (1)$$

where f is equal to signal frequency, $\sigma$ is equal to the electrical conductivity of the conductor or signal track and $\mu$ is equal to the permeability of the conductor or signal track. Accordingly, higher data rates lead to smaller skin depth, which in turn leads to higher losses.

An additional problem in the prior art has been the existence of crosstalk, which is a category of noise induced primarily by the electromagnetic coupling between signal lines. In printed wiring boards, crosstalk can occur by the electrical coupling between nearby conductors in a given layer. Crosstalk increases with longer track coupling distances and smaller separation between tracks. Furthermore, crosstalk becomes a greater problem at higher frequencies. The problems associated with crosstalk are fully discussed in U.S. patent application Ser. No. 09/443,128, filed Nov. 18, 1999, now U.S. Pat. No. 6,444,922, issued Sep. 3, 2002, which is incorporated by reference herein in its entirety. The aforementioned application discloses the use of Embedded shielded stripline (ESS) technology.

In view of the foregoing, it would be desirable to provide a technique for improving signal reach and signal integrity during signal transmission at high bit rates or high signal frequencies which overcomes the above-described inadequacies and shortcomings. More particularly, it would be desirable to minimize the losses due to non-uniform current distribution and high dielectric loss tangents. Accordingly, it would be desirable to provide a technique for manufacturing a multi-layer substrate for improving signal reach and signal integrity in an efficient and cost effective manner.

SUMMARY OF THE INVENTION

According to the present invention, a technique for facilitating signal transmission at high signal frequencies is provided. In one embodiment, the technique is realized by providing a multi-layer substrate. The multi-layer substrate comprises a conductor or pair of conductors, a first dielectric layer on a first side of the conductor or pair of conductors, and a second dielectric layer on a second side of the conductor or pair of conductors. An air channel is formed in the first dielectric layer, the air channel formed to be substantially coextensive with the conductor or pair of conductors. An electrically conductive shield surrounds the conductor or pair of conductors, the first dielectric layer, and the second dielectric layer.

In accordance with other aspects of the present invention, a multi-layer substrate comprises an elongated conductor or pair of conductors having a continuous main path and discrete spaced edges protruding from opposing edges of the continuous main path. A first dielectric layer is provided on a first side of the conductor or pair of conductors, the first dielectric layer having an air channel substantially coextensive with the continuous main path and a solid portion overlapping with the discrete spaced edges. A second dielectric layer is provided on a second side of the conductor or pair of conductors, the second dielectric layer having an air channel substantially coextensive with the continuous main path of the conductor or pair of conductors and a solid portion overlapping with the discrete spaced edges. An electrically conductive shield surrounds the conductor or pair of conductors and the first and second dielectric layers.

In accordance with further aspects of the present invention, a supporting layer is provided adjacent to at least one of the dielectric layers. The supporting layer is provided on an opposite side of the dielectric layer from the conductor or pair of conductors.

In accordance with still further aspects of the present invention, the width of the conductor or pair of conductors is increased in order to provide impedance matching in view of the low dielectric constant of the air channel.

In accordance with another aspect of the invention, a method is provided for creating embedded shielded stripline structures with air channels. The method comprises forming an air channel within a dielectric layer and placing additional layers on each side of the dielectric layer. The additional layers including at least a top layer, a bottom layer, and at least one signal layer adjacent the air channel. The method further comprises laminating the top layer, bottom layer, dielectric layer, and signal layer and forming trenches from the top layer to the bottom layer and through the dielectric layer and signal layer. Finally, the method comprises applying metallization to the trenches.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, abut are intended to be exemplary only.

DETAILED DESCRIPTION OF EXEMPLARY EMBODIMENT

Figure 1A:
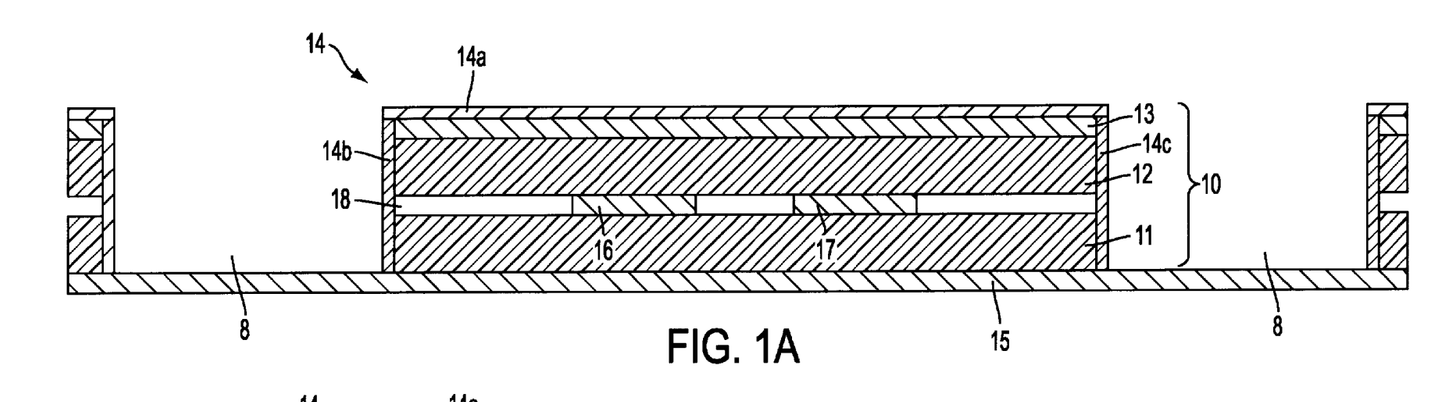
FIG. 1A is a cross-sectional view of a differential pair substrate using Embedded Shielded Stripline (ESS) technology.

Referring to FIG. 1A, there is shown a substrate 10 including a dielectric material 11 having a ground layer 15 along its lower surface. In this embedded stripline configuration, conductors 16 and 17 are embedded between the dielectric layer 11 and an additional dielectric layer 12. Metal reference layers are positioned adjacent the dielectric layers. Reference layers are low impedance metallic planes, which can include primary layers, secondary layers, and ground layers. It should be understood that any type of reference layers can be positioned between the dielectric layers. In the embodiment shown in FIG. 1A, a primary layer 13 is positioned over the dielectric layer 12. In order to minimize crosstalk, a coating 14, having an upper surface 14a and side surfaces 14b and 14c is provided together with ground layer 15. The coating 14 is preferably copper and forms a complete shield around the conductors 16 and 17. Spaces 18 exist only in preliminary manufacturing stages. The dielectric materials in the surrounding layers, which may include core and prepreg material, generally meld together around the conductors to fill the gaps 18. In a single ended embodiment shown in FIG. 1B, only one conductor 16 is provided. In both embodiments, trenches 8 are formed to create the shields.

Figure 1B:
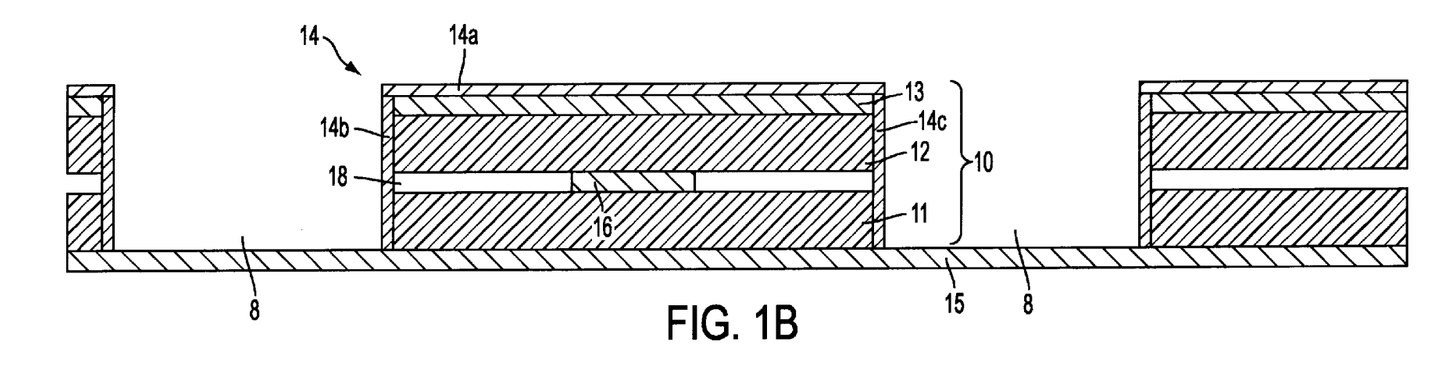
FIG. 1B is a cross-sectional view of a single ended multi-layer substrate using ESS technology.

These continuous electrically conductive shields described above are beneficial for reducing or eliminating cross-talk between signals propagating along adjacent signal conductors 16 and 17, as described in related U.S. patent application Ser. No. 09/443,128, filed Nov. 18, 1999, now U.S. Pat. No. 6,444,922, issued Sep. 3, 2002, which is incorporated by reference herein in its entirety.

Figure 2A:
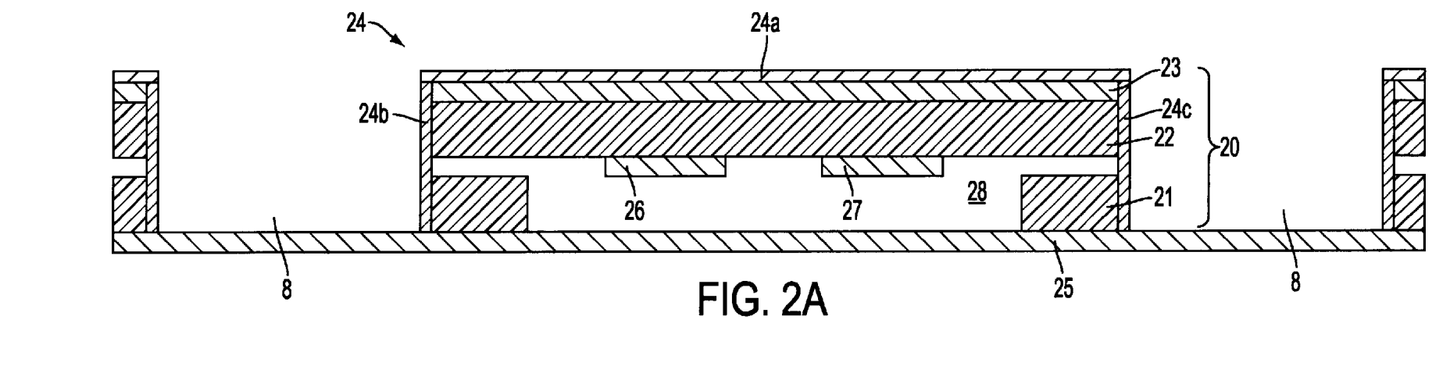
FIG. 2A is a cross-sectional view of a differential pair multi-layer substrate of an embodiment of the invention.
Figure 2B:
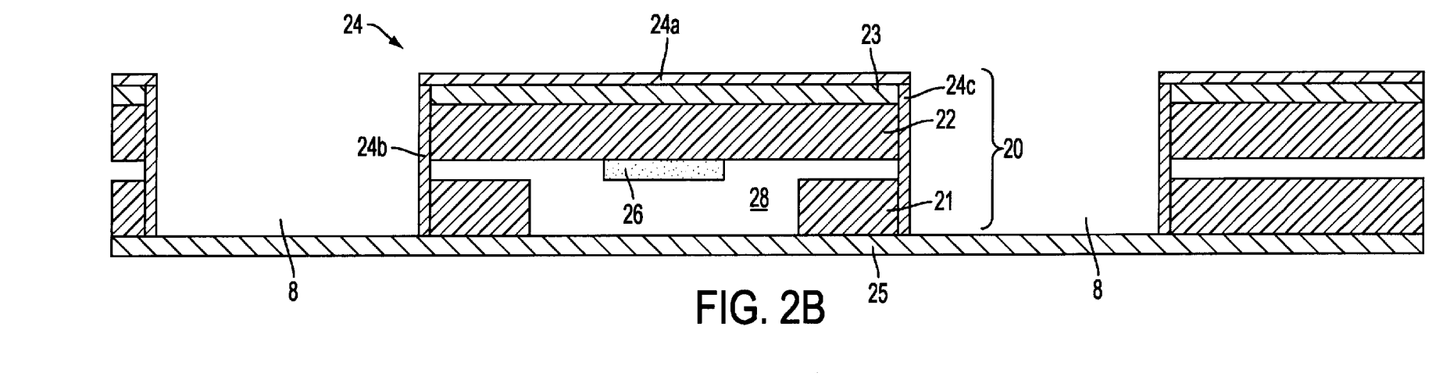
FIG. 2B is a cross-sectional view of a single ended multi-layer substrate of an embodiment of the invention.

Referring to FIGS. 2A and 2B, the multi-layered substrates of FIGS. 1A and 1B have been modified to incorporate an air channel 28. The substrate 20 includes a primary layer 23 and a secondary layer 25 forming opposing boundaries. The primary layer 23 and the secondary layer 25 are typically formed from copper, but they may be formed from any other suitable equivalent material. Between the primary and secondary layers 23, 25 are dielectric layers 21 and 22. The air channel 28 is created in the dielectric layer 21.

In the differential pair embodiment of FIG. 2A, conductors 26 and 27 are connected with the dielectric layer 22 and extend through the air channel 28. In the single ended embodiment of FIG. 2B, only one conductor 26 is attached to the dielectric 22 and extends through the air channel 28. In both embodiments, trenches 8 are again created to create the shields.

The aforementioned dielectric layers 21 and 22 may be formed from any suitable material and may in fact be formed from differing dielectric materials having different dielectric constants, so as to vary propagation speed.

The conductors 26 and 27 and primary and secondary layers 23 and 25 are preferably formed of copper. In an embodiment of the invention, the conductors 26 and 27 and primary and secondary layers 23 and 25 are formed to have a thickness of approximately 0.65 mils and have a width of approximately 9 mils. The width will have a value designed to meet impedance requirements. The larger the air space, the wider the conductors will become in order to achieve the desired impedance.

The air channel 28 is preferably laser milled into the dielectric layer 21. The air channel 28 may be formed by alternative methods such as by the manufacturing of trenches using microvia technology or by using mechanical routing of the air channel 28 in the dielectric layer 21. The dielectric constant of the air channel is 1.0 and the thickness dimension of the air channel preferably corresponds to the thickness of the dielectric layer 21, which is approximately 6 mils in the provided embodiment. The top two layers are approximately 4 and 6 mils.

The conductors 26, 27 are bordered on one side by the dielectric layer 22, having a given dielectric constant which is greater than 1.0, and on an opposite side by the air channel 28, which has a dielectric constant of approximately 1.0. Regardless of the material chosen for the dielectric layers, the air channel 28 will always have a lower dielectric constant of approximately 1.0, thereby enhancing propagation speed. The exact propagation speed achieved will depend upon the characteristics of the dielectric material.

A conductive shield 24 (formed by 24a, 24b, and 24c) is provided to surround the entire structure in order to minimize cross-talk between conductors. The conductive shield 24 is preferably formed of copper.

In order to construct the substrate shown in FIGS. 2A and 2B, the air channel 28 is formed in the dielectric layer 21. As a next step, all of the layers are laminated so that the air channel 28 is adjacent to the conductors 26, 27. Next, the trenches 8 are created between the electrically conductive shields 24. The trenches 8 may be created using various techniques including laser ablation, scoring, chemical etching, photolithography, mechanical milling or any other suitable chemical or mechanical method. The methods for creating the trenches are more thoroughly described in U.S. patent application Ser. No. 09/443,128, filed Nov. 18, 1999, now U.S. Pat. No. 6,444,922, issued Sep. 3, 2002, which is incorporated by reference herein in its entirety. After forming the trenches 8, which extend from the surface layer 24 to the base layer 25, metallization is then applied to the sidewalls and the bottom of the trenches 8, thereby resulting in the formation of complete electrically conductive shields.

Figure 3A:
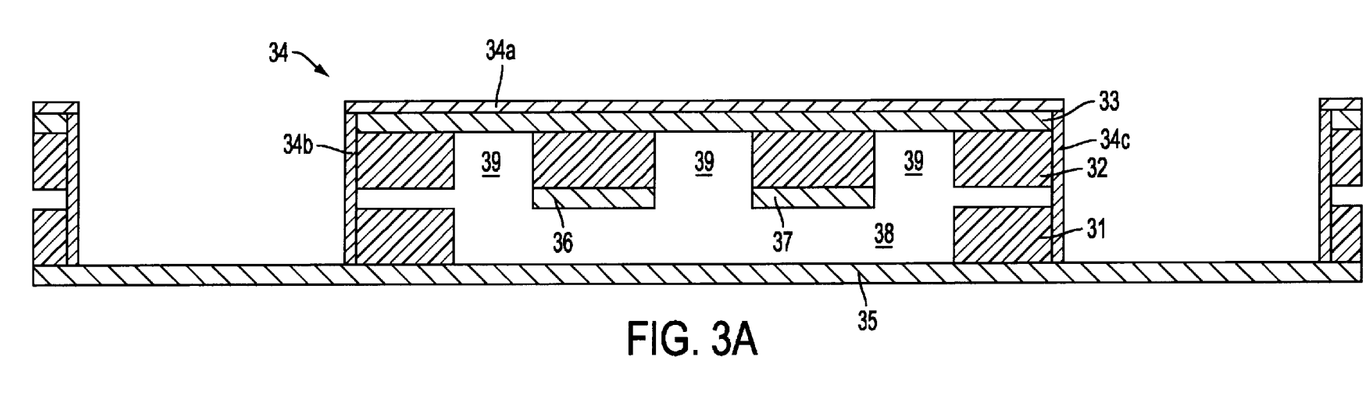
FIG. 3A is a cross-sectional view of a differential pair multi-layer substrate of another embodiment of the invention.
Figure 3B:
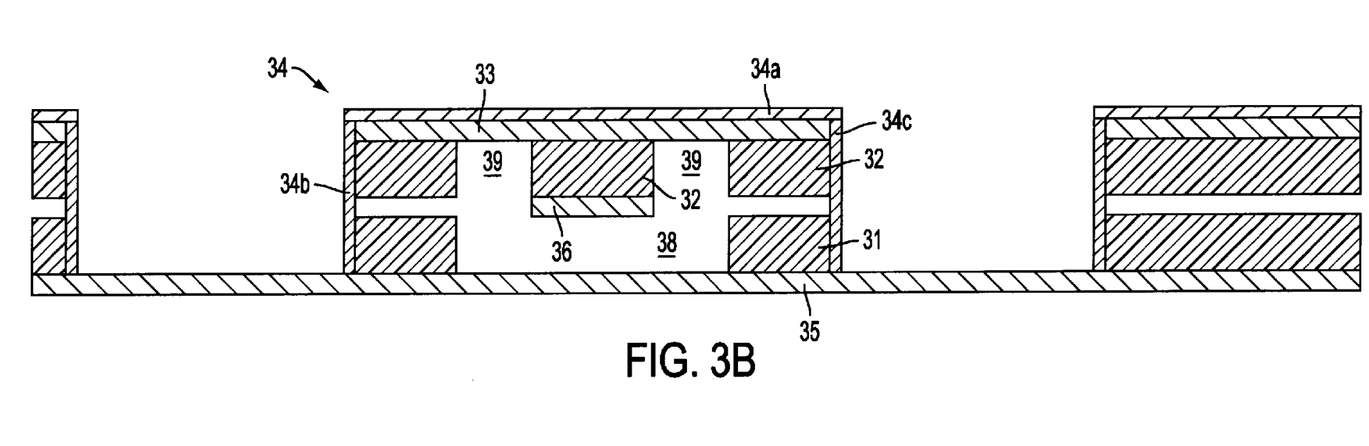
FIG. 3B is a cross-sectional view of a single ended multi-layer substrate corresponding to the embodiment of FIG. 3A.

FIGS. 3A and 3B illustrate an alternative embodiment of the invention. FIG. 3A illustrates a differential pair embodiment in which a primary conductive layer 33 and a secondary conductive layer 35 are provided. A dielectric layer 31 is positioned adjacent the secondary layer 35 and an air channel 38 is created within the dielectric layer 31. A dielectric layer 32 is provided adjacent the primary layer 33 and a plurality of air channels 39 are created within the dielectric layer 32. The dielectric layer 32 supports conductors 36 and 37 (see FIG. 3A). A conductive shield 34 includes components 34a, 34b, and 34c and surrounds the aforementioned components. In the single ended embodiment shown in FIG. 3B, only one conductor 36 is provided.

Figure 4A:
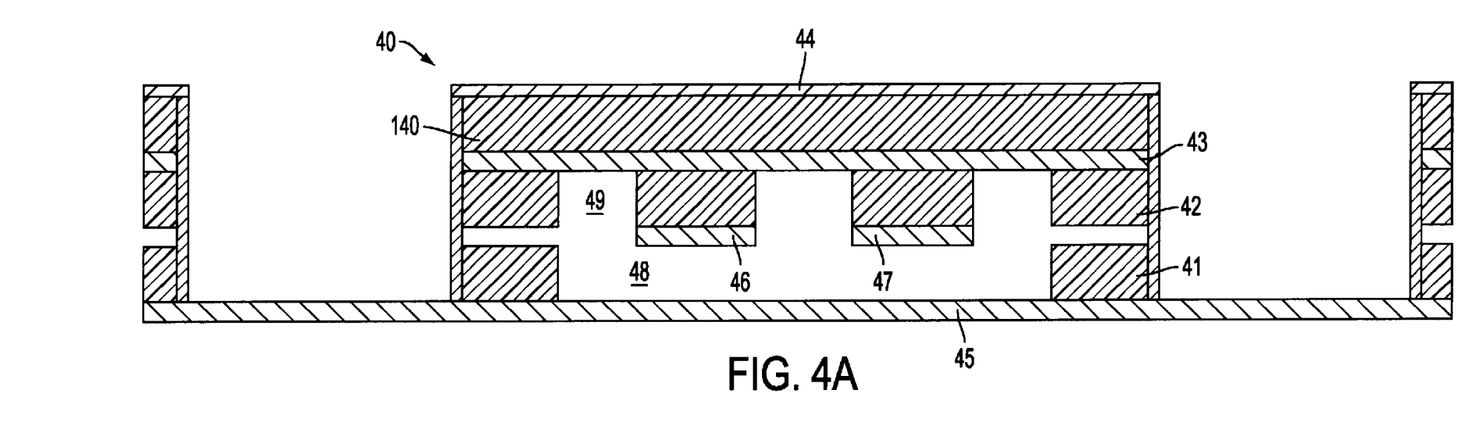
FIG. 4A is a cross-sectional view of a differential pair multi-layer substrate of another embodiment of the invention.
Figure 4B:
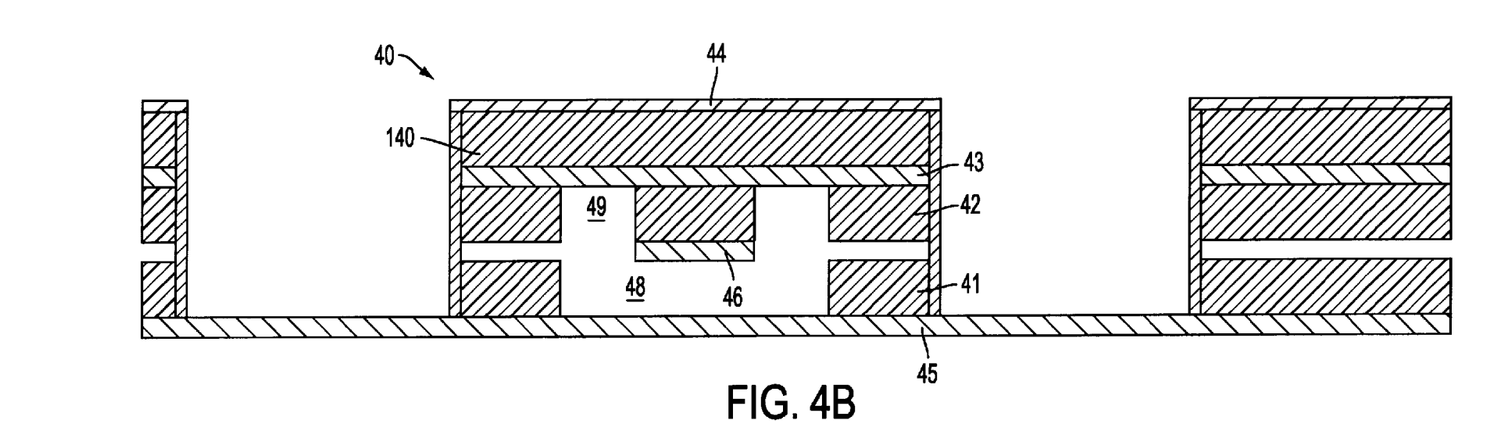
FIG. 4B is a cross-sectional view of a single ended multi-layer substrate corresponding to the embodiment of FIG. 4A.

In the embodiment shown in FIGS. 3A and 3B, which includes including primary layer 33 becomes an issue. The structure is multiple air channels 38 and 39, weakness of the top surface including primary layer 33 becomes an issue. The structure is likely to sag without reinforcement. Accordingly, an alternative substrate embodiment 40 is provided as shown in FIGS. 4A and 4B. A reinforced top surface is provided through the addition of a dielectric layer 140 between a conductive shield 44 and a primary conductive layer 43. In this manner, conductors 46 and 47 (see FIG. 4A) have improved support when multiple air channels 48 and 49 are formed in dielectric layers 41 and 42. A secondary conductive layer 45 is also provided. As in the previous embodiments, FIG. 4A shows a single ended embodiment in which only a single conductor 46 is provided.

Figure 5A:
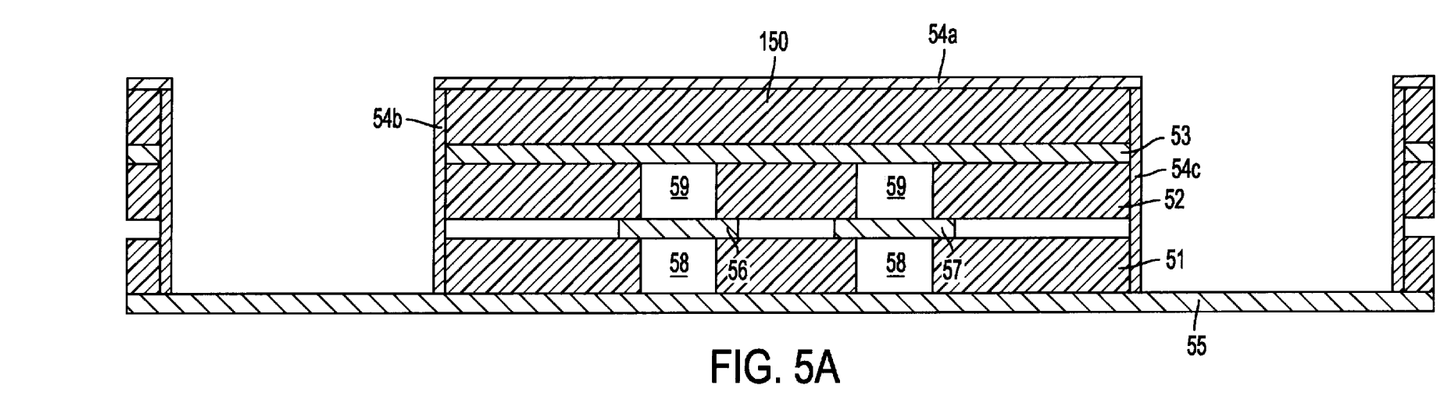
FIG. 5A is a cross-sectional view of a differential pair multi-layer substrate of another embodiment of the invention.
Figure 5B:
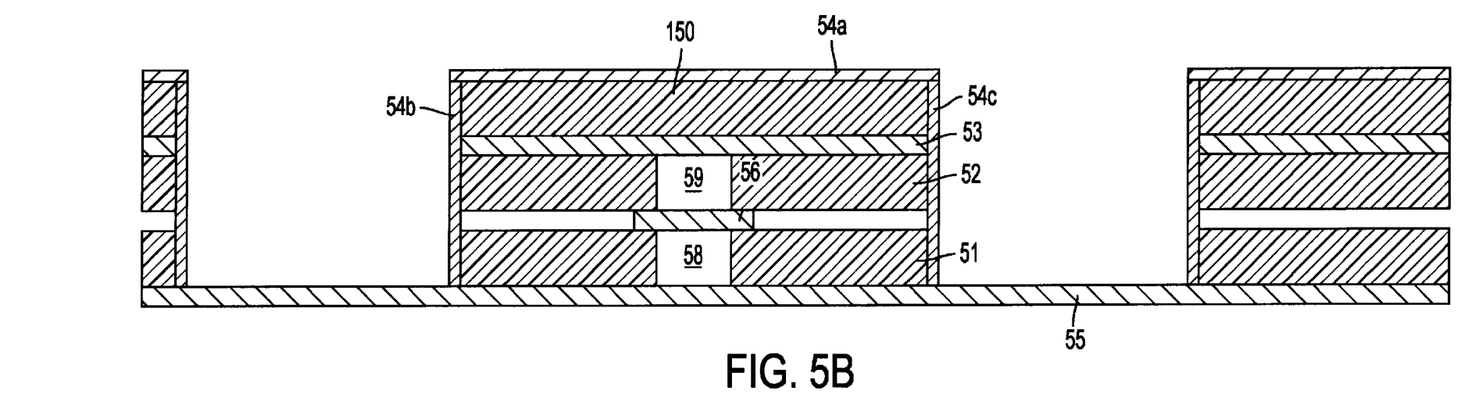
FIG. 5B is a cross-sectional view of a single ended multi-layer substrate corresponding to the embodiment of FIG. 5A.

FIGS. 5A and 5B illustrate an additional embodiment in which striplines 56 and 57 (see FIG. 5A) are suspended between dielectric layers 51 and 52. As in the previous embodiment, multiple air channels 58 and 59 are formed in the dielectric layers 51 and 52. The striplines 56 and 57 are bordered by air channels 58 and 59 on both sides. A primary conductive layer 53 is also provided. Accordingly, since the striplines 56 and 57 see a low dielectric constant, propagation speed is greatly enhanced. Furthermore, a support structure 150 is provided for strengthening the top surface. A conductive shield 54a, 54b, and 54c surrounds the substrate. In FIG. 5B, a single ended embodiment is provided in which only a single suspended stripline 56 suspended between the substrates 51 and 52.

Figure 6A:
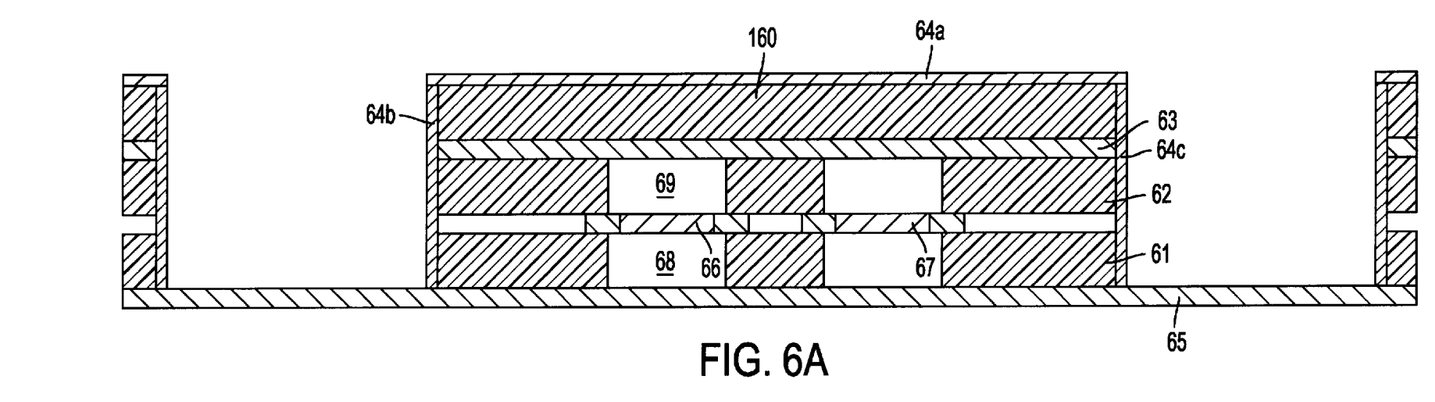
FIG. 6A is a cross-sectional view of a differential pair multi-layer substrate of another embodiment of the invention.
Figure 6B:
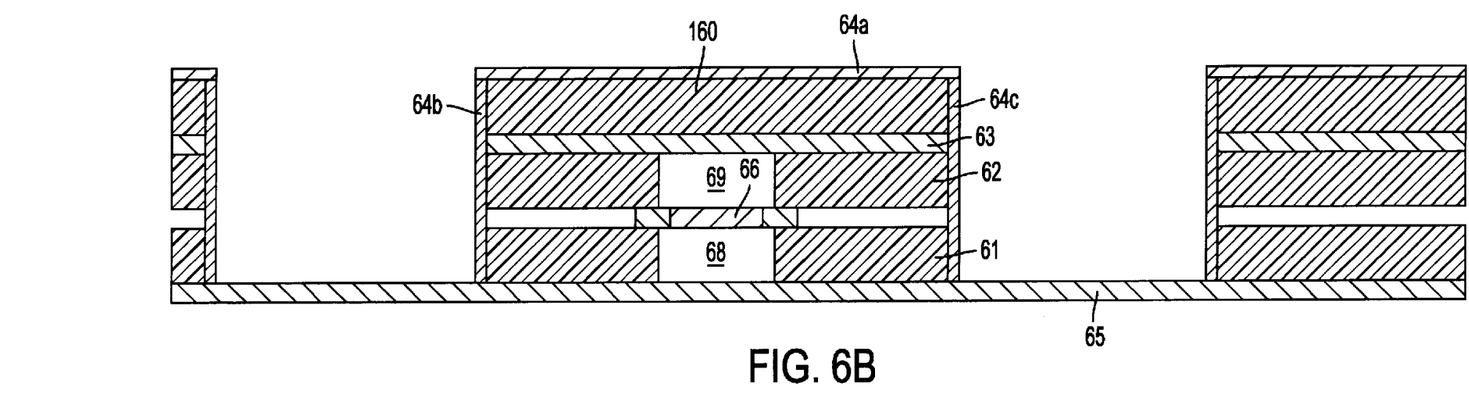
FIG. 6B is a cross-sectional view of a single ended multi-layer substrate corresponding to the embodiment of FIG. 6A.

FIGS. 6A and 6B are cross-sectional views of an additional embodiment of the invention which is aimed at minimizing losses. In the embodiments of FIGS. 6A and 6B, striplines 66 and 67 (see FIG. 6A) are provided. As in the previous embodiments, multiple air channels 68 and 69 are formed in dielectric layers 61 and 62. The striplines 66 and 67 are bordered by air channels 68 and 69 on both sides. A primary conductive layer 63 and a secondary conductive layer 65 are also provided. Furthermore, a support structure 160 is provided for strengthening the top surface. A conductive shield 64a, 64b, and 64c surrounds the substrate. In FIG. 6B, a single ended embodiment is provided in which only a single suspended stripline 66 suspended between the substrates 61 and 62. The striplines 66 and 67 include castled edges, as more clearly shown in FIGS. 7A and 7B, which are aimed at minimizing losses.

Figure 7A:
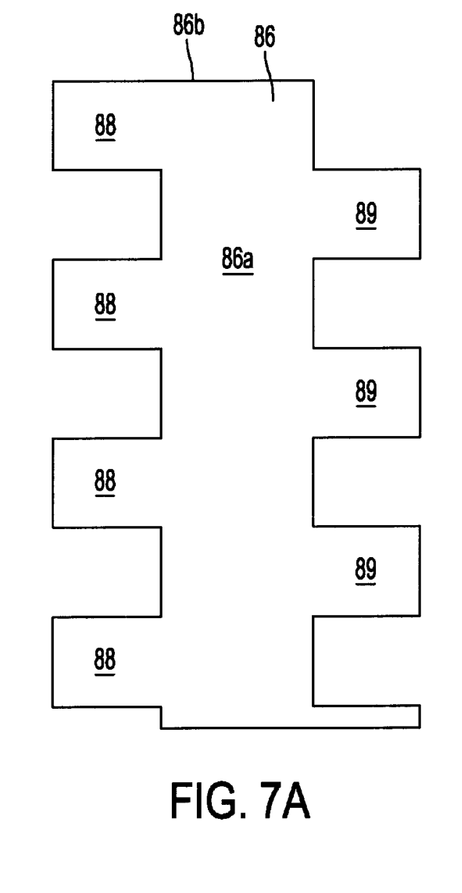
FIG. 7A is a top plan view of a stripline having castled edges in an embodiment of the invention.
Figure 7B:
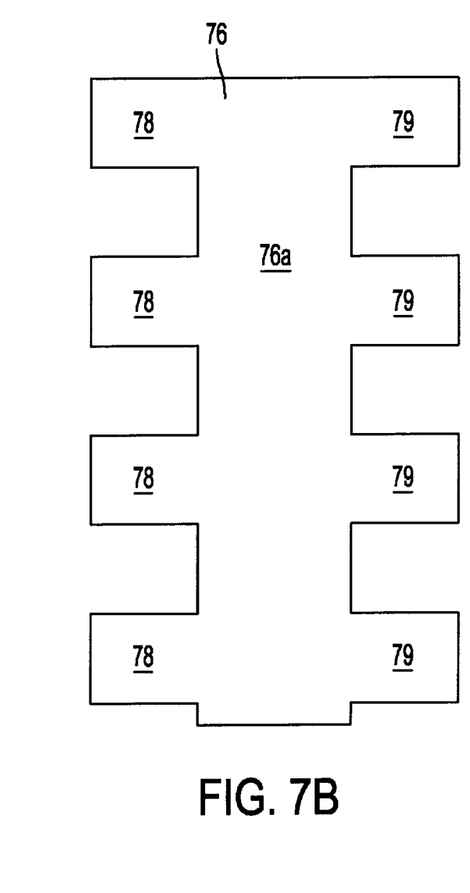
FIG. 7B is a top plan view of an alternative embodiment of a stripline having castled edges.

FIGS. 7A and 7B show two embodiments of the striplines 66 and 67 shown in FIGS. 6A and 6B. The displayed configurations include "castled" edges.

Castled edges can be obtained by subtracting or removing the electrical conductor material from the transmission lines of uniform width described in the previous embodiments such as in FIGS. 5a and 5b. This will increase the characteristic impedance of the transmission line, since the capacitance of the conductor will be reduced by the action of decreasing its surface area, and the impedance of the transmission line is inversely proportional to the root of its capacitance:

$$z=\sqrt{(L/C)} \qquad (2)$$

where Z is equal to characteristic impedance, L is equal to inductance, and C is equal to capacitance. With castled edges, an impedance Z' can be created as follows:

$$z'=\sqrt{(L/(C-\Delta C))} \qquad (3)$$

wherein ΔC represents the change in capacitance caused by the reduced surface area of the castled edges. Thus, a higher impedance Z' results. This now permits increasing the width of the conductor in the region between the castled edges in order to restore the characteristic impedance to its original design value. This action results in a lower conductor resistance which lowers the conductor loss. In addition, the presence of the castled edges increases the path length along the conductor edges where the current concentration is high due to skin effect at high frequencies; this suppresses the flow of edge currents and aids in redistributing the current flow over a greater portion of the central conductor region, thereby reducing losses due to skin effect. A further benefit of the castled edges is that a greater portion of the conductor capacitance is formed by an air dielectric as opposed to the solid and potentially lossier dielectric of the supporting structure; since the dielectric loss of air is virtually zero, a net reduction of the total dielectric loss occurs.

As shown in FIG. 7A, a preferred embodiment of a castled edge stripline 86 has a continuous main path 86a and castled edges or protrusions 88, 89. The protrusions 88 are located at a first set distances from an edge 86b of the stripline 86. The protrusions 89 are located at a second set of distances from the edge 86b, such that the protrusions 86, 89 on opposing sides of the main path 86a do not overlap with one another, thereby creating a constant impedance.

An alternative embodiment is provided in FIG. 7B. In this embodiment, the protrusions 78 and 79 are aligned with one another across the continuous main path 76a of the stripline 76.

In general, in the embodiments of both FIGS. 7A and 7B, current travels through the continuous main path 86a, 76a. Other current dissipates from the main path through the protrusions 88, 89, 78, 79. Because the protrusions 88, 89, 78, 79 are in contact with the dielectric layers 61, 62 as shown in FIGS. 6A and 6B, the edges do not see the air channels 68 and 69, which have a lower dielectric constant.

A further measure for controlling impedance includes controlling the width of the above-disclosed striplines. For a given substrate layer thickness, lowering the dielectric constant means that the width of the stripline needs to be increased in order to provide the correct impedance. In a single ended embodiment, 50 ohms is a preferred impedance and in the single ended embodiment and 100 ohms is the preferred impedance in the differential pair embodiment. When wider conductors and air channels are used to achieve a design impedance, benefits are derived including greater signal reach and no dielectric loss. These features are extremely important at high bit rates or high signal frequencies such as 10 Gb, because signal integrity becomes difficult with longer track lengths.

Typically, a differential pair stripline, designed for 100 ohms differential impedance may be disposed adjacent a dielectric material having a dielectric constant of approximately 3.1. The dielectric material is approximately 4 mils thick above the conductors and 6 mils thick below the conductors. In such an embodiment, using a dielectric loss tangent of 0.006, the track or conductor widths should be approximately 5 mils, with a 5 mil spacing between the inside edges of the conductors. Alternatively, if a width of 5.5 mils is used, a spacing of 7.5 mils is optimal. The resultant signal loss in this instance is 0.34 dB per inch.

In another embodiment, with air as the dielectric, the loss tangent is equal to zero and the dielectric constant is equal to 1.0. Accordingly the conductors must be made even wider to obtain 100 ohms. Specifically, the conductors must have a width of 12 mils and a spacing of 14 mils assuming the dielectric spacing of 4 mils and 6 mils as specified above. The resultant signal loss is 0.24 dB per inch. The decrease in loss is due to the use of air channels to increase signal reach. Calculation of loss as related to the width of a transmission line is fully explained in S. B. Cohn, "Characteristic Impedance of the Shielded-Strip Transmission Lines", IRE Trans., Vol. MTT-3, March 1955, p. 119–126 and in H. A. Wheeler, "Transmission-Line Properties of Parallel Wide Strips by a Conformal-Mapping Approximation", IEEE Trans., Vol. MTT-12, May 1964, p.280–289.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A multi-layer substrate comprising:

a conductor having a conductor width;

a first dielectric layer on a first side of the conductor, the first dielectric layer having a support portion for supporting the conductor on the first side of the conductor, the support portion having a support width that is equal to the conductor width;

a second dielectric layer on a second side of the conductor, the second dielectric layer having an air channel formed therein that is substantially coextensive with and exposed to the conductor; and a conductive shield substantially enclosing the conductor, at least the support portion of the first dielectric layer, and at least the air channel of the second dielectric layer.

2. The multi-layer substrate of claim 1, further comprising:

a conductive layer formed adjacent the first dielectric layer on an opposite side from the conductor.

3. The multi-layer substrate of claim 2, further comprising:

a support layer formed adjacent the conductive layer on an opposite side from the first dielectric layer.

4. The multi-layer substrate of claim 3, wherein the conductive shield is formed adjacent the support layer on an opposite side from the conductive layer.

5. The multi-layer substrate of claim 2, wherein the conductive layer forms a part of the conductive shield.

6. The multi-layer substrate of claim 1, wherein a trench is formed in the first dielectric layer and the second dielectric layer so as to expose lateral sides of the first dielectric layer and the second dielectric layer, wherein a portion of the conductive shield is formed along the exposed lateral sides of the first dielectric layer and the second dielectric layer.

7. The multi-layer substrate of claim 1, wherein the first dielectric layer and the second dielectric layer are formed from differing dielectric materials having different dielectric constants such that signal propagation speeds vary in the conductor.

8. The multi-layer substrate of claim 1, wherein the conductive shield extends substantially an entire length of the conductor, at least the support portion of the first dielectric layer, and at least the air channel of the second dielectric layer.

9. The multi-layer substrate of claim 1, wherein the conductor is a first conductor having a first conductor width and the support portion is a first support portion having a first support portion width, further comprising:

a second conductor having a second conductor width;

a second support portion formed in the first dielectric layer for supporting the second conductor on the first side of the second conductor, the second support portion having a second support width that is equal to the second conductor width.

10. The multi-layer substrate of claim 9, wherein additional air channels are formed in the first dielectric layer on both sides of the first and second support portions, wherein the additional air channels are disposed adjacent to the air channel formed in the second dielectric layer such that a single contiguous air channel is formed around three sides of the first conductor and the second conductor.

11. The multi-layer substrate of claim 1, wherein additional air channels are formed in the first dielectric layer on both sides of the support portion, wherein the additional air channels are disposed adjacent to the air channel formed in the second dielectric layer such that a single contiguous air channel is formed around three sides of the conductor.

12. The multi-layer substrate of claim 1, further comprising:

a conductive layer formed adjacent the second dielectric layer on an opposite side from the conductor, wherein the conductive layer forms a part of the conductive shield.

* * * * *